(12) United States Patent
Tu et al.

(10) Patent No.: US 6,808,948 B1
(45) Date of Patent: Oct. 26, 2004

(54) TEST STRUCTURES TO DEFINE COP ELECTRICAL EFFECTS

(75) Inventors: Amy C. Tu, San Jose, CA (US); Eugene W. Hill, Moss Beach, CA (US); Samantha L. Doan, Mountain View, CA (US); Mike Y. Kao, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 147 days.

(21) Appl. No.: 10/317,797

(22) Filed: Dec. 11, 2002

(51) Int. Cl.[7] .............................................. H01L 21/66
(52) U.S. Cl. ............................. 438/17; 438/18; 257/48
(58) Field of Search ....................... 438/17, 18; 257/48

(56) References Cited

U.S. PATENT DOCUMENTS

| 5,736,863 A | * | 4/1998 | Liu ............................ 324/765 |
| 5,943,552 A | * | 8/1999 | Koveshnikov et al. ......... 438/17 |
| 6,384,415 B1 | * | 5/2002 | Suzuki et al. ............. 250/341.4 |
| 6,441,396 B1 | * | 8/2002 | Adams et al. ................. 257/48 |
| 2003/0071262 A1 | * | 4/2003 | Weiner et al. ................ 257/48 |

* cited by examiner

*Primary Examiner*—Mary Wilczewski
*Assistant Examiner*—Toniae M. Thomas
(74) *Attorney, Agent, or Firm*—Winstead Sechrest & Minick P.C.

(57) ABSTRACT

A method for evaluating the effect of crystalline originated pits (COP's) in a silicon substrate on semiconductor devices method locates a first test structure created on a COP on the substrate and a second test structure created on the substrate but not on a COP. The electrical properties of the first and second test structure are then examined and compared. If there is a difference in their electrical properties, then the COP would affect a structure similar to the test structures of a semiconductor device. In this manner, the effects of COP's on the yield for the substrate can be understood.

9 Claims, 5 Drawing Sheets

TEST STRUCTURES TO DEFINE COP ELECTRICAL EFFECTS

FIELD OF THE INVENTION

The present invention relates to crystalline originated pits (COP's) in silicon wafers, and more particularly to the electrical effects of COP's on semiconductor devices.

BACKGROUND OF THE INVENTION

Silicon substrates are manufactured with varying amount of crystalline originated pits (COP's) defects. COP's are vacancies in the crystalline structure of the substrate. A semiconductor device manufacturer can decide to purchase silicon wafers with a maximum amount of COP's. Typically, the more COP's a substrate has, the less expensive it is. The semiconductor device manufacturer can quantify the COP's in the substrate but has difficulty in determining the electrical effects on the semiconductor devices that would be on the substrate. Thus, it is unknown how large of an effect the COP's would have on the yield for that substrate. Understanding the effect on yield would help the semiconductor device manufacturer to determine what quality of substrate would be needed to meet a certain specification.

Accordingly, there exists a need for a method for evaluating the effect of COP's in a silicon substrate on semiconductor devices. The present invention addresses such a need.

SUMMARY OF THE INVENTION

A method for evaluating the effect of crystalline originated pits (COP's) in a silicon substrate on semiconductor devices method locates a first test structure created on a COP on the substrate and a second test structure created on the substrate but not on a COP. The electrical properties of the first and second test structure are then examined and compared. If there is a difference in their electrical properties, then the COP would affect a structure similar to the test structures of a semiconductor device. In this manner, the effects of COP's on the yield for the substrate can be understood.

DETAILED DESCRIPTION

The present invention provides a method for evaluating the effect of crystalline originated pits (COP's) in a silicon substrate on semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 1 through 6 in conjunction with the discussion below.

Figure 1:
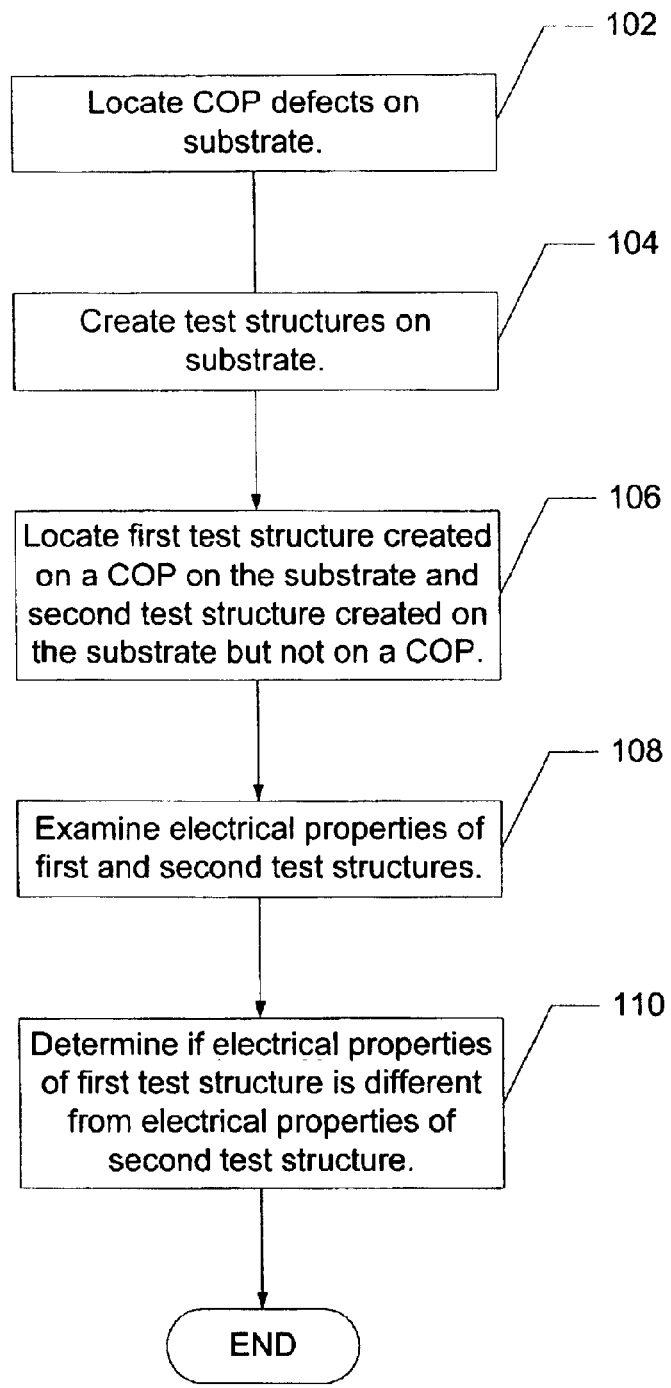
FIG. 1 is a flowchart illustrating a preferred embodiment of a method for evaluating the effect of crystalline originated pits (COP's) in a silicon substrate on semiconductor devices in accordance with the present invention.

FIG. 1 is a flowchart illustrating a preferred embodiment of a method for evaluating the effect of COP's in a silicon substrate on semiconductor devices in accordance with the present invention. First, the COP defects on the substrate are located, via step 102, by scanning the substrate. Next, test structures are created on the substrate, via step 104 by printing on the substrate using a mask. Then, a first test structure that was created on a COP on the substrate, and a second test structure that was created on the substrate but not on a COP are located, via step 106. In the preferred embodiment, the first and second test structures are located by overlaying a "map" of the COP defects located in step 102 with the test structures printed on the substrate. The electrical properties of the first and second test structures are then examined, via step 108. Then, it is determined if the electrical properties of the first test structure is different from the electrical properties of the second test structure, via step 110. If they are different, then the COP would affect a structure like the test structures of the semiconductor device. If they are not different, then the COP would not affect a structure like the test structures of the semiconductor device.

Figure 2:
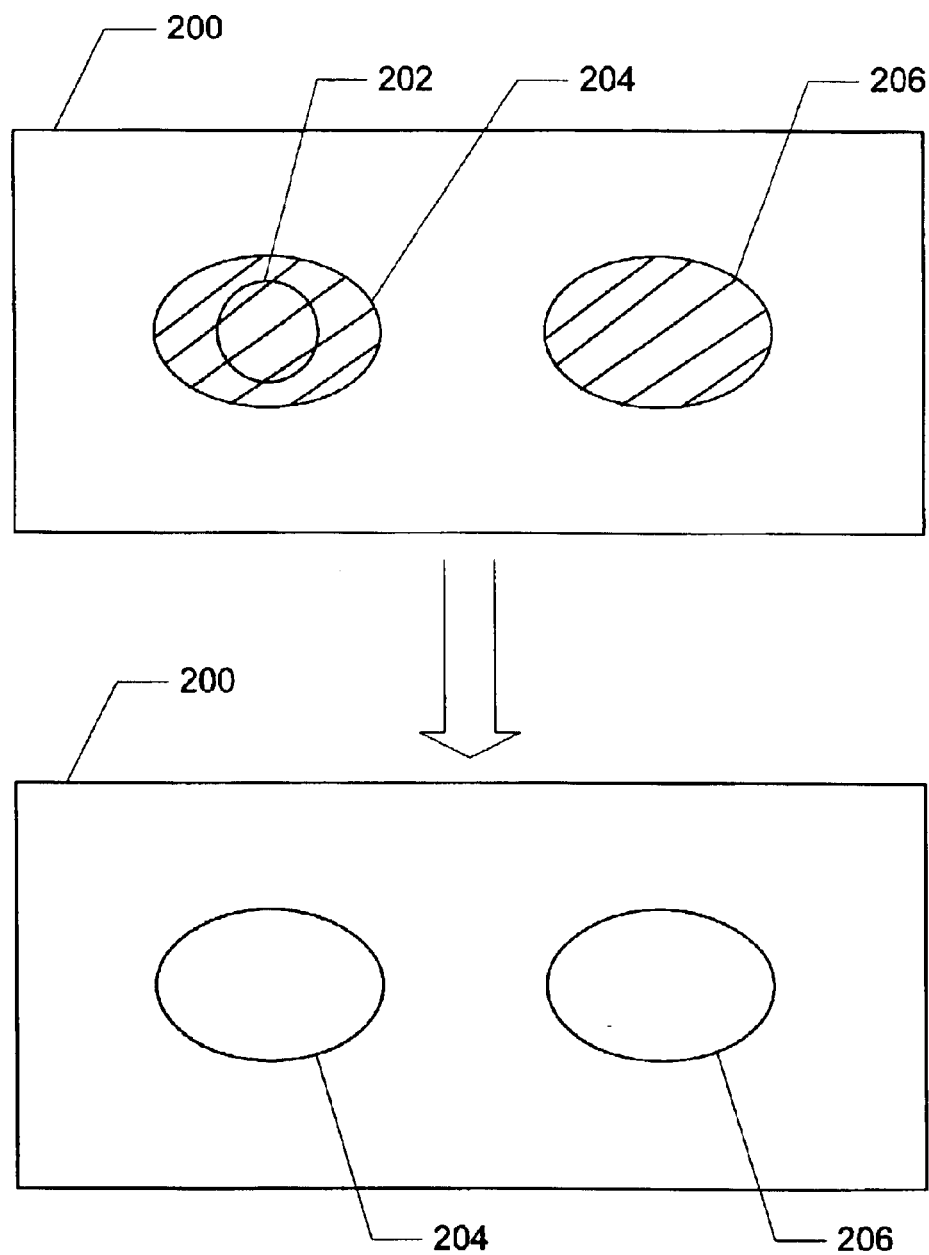
FIG. 2 is a surface view of a substrate, illustrating a first example of the method for evaluating the effect of COP's in a silicon substrate on semiconductor devices in accordance with the present invention.

FIG. 2 is a surface view of a substrate, illustrating a first example of the method for evaluating the effect of COP's in a silicon substrate on semiconductor devices in accordance with the present invention. In the first example, the test structure is an implant, such as a N+ implant typically used to form the active regions of a semiconductor device. First, the COP's on the substrate 200, such as the COP 202, are located, via step 102. Next, test structures are created on the substrate 200, via step 104. As illustrated in the top diagram in FIG. 2, a first test structure 204, i.e., a first N+ implant area, that was created on a COP 202 is located, via step 106. A second test structure 206, i.e., a second N+ implant area, that was created on the substrate 200 but not on a COP is located, via step 106. The substrate 200, including the first 204 and second 206 N+ implant areas, are then examined using a Scanning Electron Microscope (SEM) tool, via step 108. The SEM tool is known in the art. Using the SEM tool, it is determined if the first 204 and second 206 N+ implant areas appear different, via step 110. If the first 204 and second 206 N+ implant areas are electrically different, then they would light up differently under the SEM tool. The bottom diagram in FIG. 2 illustrates an example of the first 204 and second 206 N+ implant areas lighting up differently under the SEM tool. The COP 202, in this case, would negatively affect N+ implants of a semiconductor device, and thus the yield for the substrate 200. If the first 204 and second 206 N+ implant areas are not electrically different, then they would light up similarly, indicating that the COP 202 would not negatively affect N+ implants of a semiconductor device.

Figure 3:
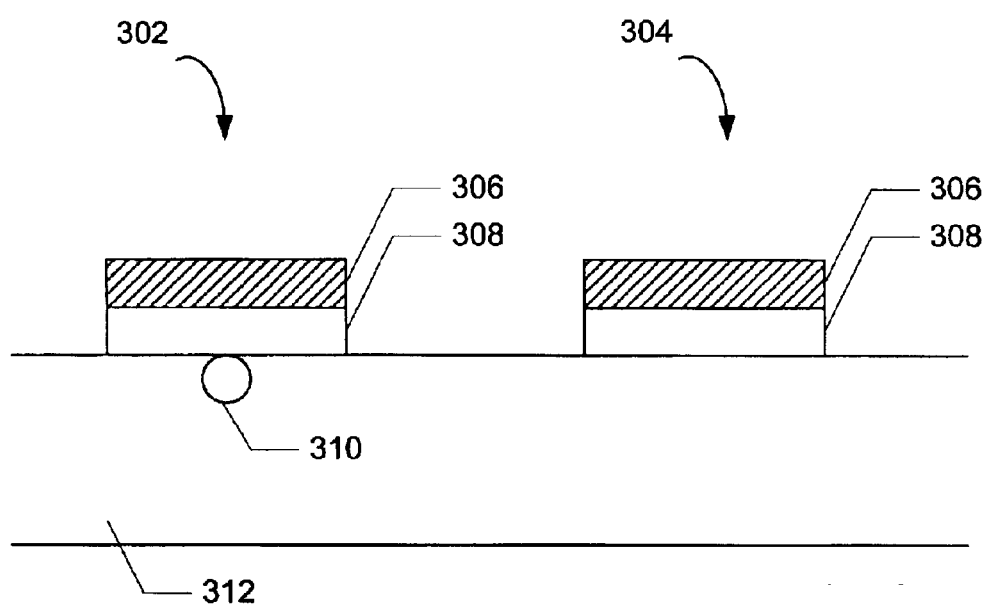
FIG. 3 is a cross-sectional view of a substrate, illustrating a second example of the method for evaluating the effect of COP's in a silicon substrate on semiconductor devices in accordance with the present invention.

FIG. 3 is a cross-sectional view of a substrate, illustrating a second example of the method for evaluating the effect of COP's in a silicon substrate on semiconductor devices in accordance with the present invention. In the second example, the test structure is a diode, comprising a polysilicon layer 306 on a gate oxide layer 308. First, the COP's on the substrate 312, such as the COP 310, are located, via step 102. Next, test structures, or diodes, are created on the substrate 312, via step 104. A first test structure 302, i.e., a first diode, that was created on the COP 310 is located, via step 106. A second test structure 304, i.e., a second diode, that was created on the substrate 312 but not on a COP is located, via step 106. The junction breakdown voltages of the first 302 and second 304 diodes are then measured, via step 108. If there is a difference between the junction breakdown voltages of the first 302 and second 304 diodes, then the COP 310 would impact the junction breakdown voltage of a semiconductor device, via step 110. If there is minimal difference between the junction breakdown voltages of the first 302 and second 304 diodes, then the COP 310 would not negatively affect the junction breakdown voltage of a semiconductor device.

Figure 4A:
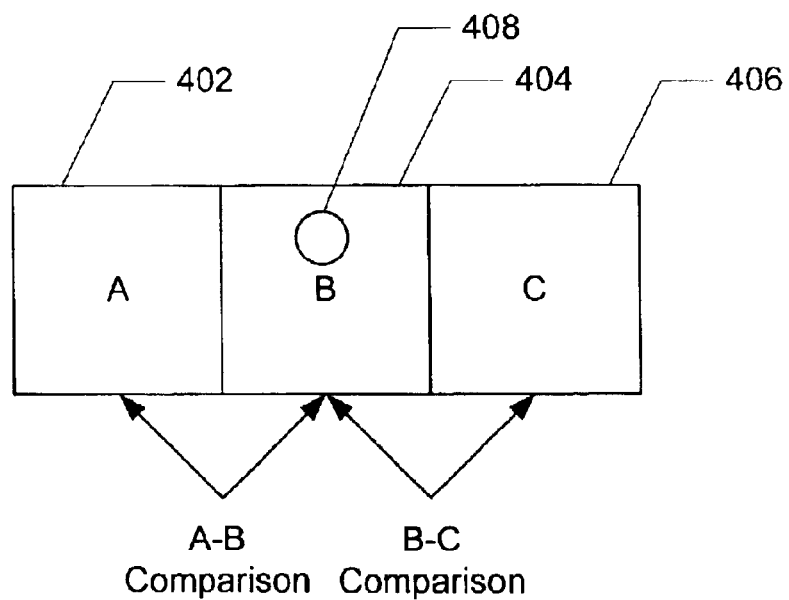
FIGS. 4A and 4B illustrate a conventional method in locating defects on a silicon substrate.
Figure 4B:
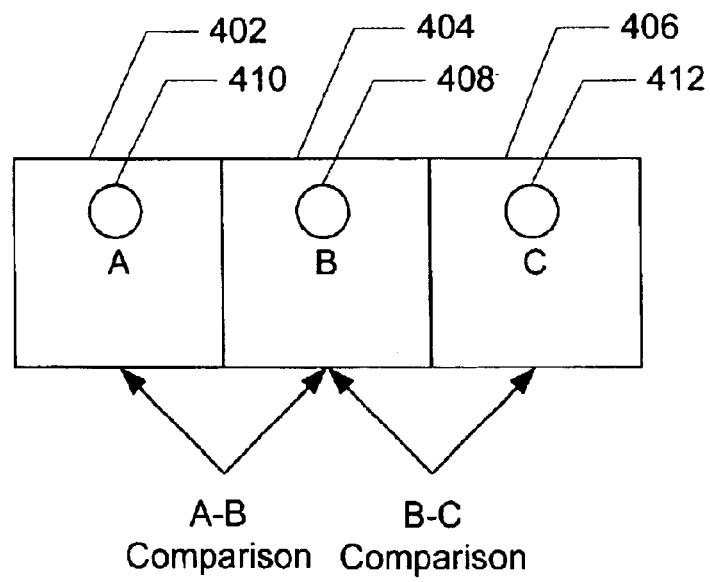

Sometimes, the locating of a defect, such as a COP or some other defect, can be difficult using the SEM tool or an optical defect inspection tool. An optical defect inspection tool is known in the art. FIGS. 4A and 4B illustrate a conventional method in locating defects on a silicon substrate. The substrate is divided into sections, such as sections 402, 404 and 406. As illustrated in FIG. 4A, assume that defect 408 is located in section 404. To locate the defect 408, sections 402 and 404 are compared and/or sections 404 and 406 are compared under either optical inspection tool. Since the comparisons would show that section 404 is different, then a defect 408 is assumed to reside in section 404. However, as illustrated in FIG. 4B, if defects 410, 408, and 412 reside in all three sections 402, 404, and 406, respectively, then the comparisons would not indicate that defects exist in these sections.

To address this problem, a defect library is created and used in detecting the defects. The defect library comprises images of known defects, either captured from defects found in the past or from test structures with intentionally created defects. Each section of the substrate is then compared with the images in the defect library rather than with other sections of the substrate. In this manner, the defects 408, 410, and 412 can be recognized. The defect library can be stored on the optical inspection tool itself or elsewhere.

Alternatively, an image of a good section can be stored as a "Golden Image". Each section of the substrate is then compared with this Golden Image under the optical inspection tool. If the section looks differently than the Golden Image, then a defect resides on the section. As with the defect library, the Golden Image can be stored on the optical inspection tool itself or elsewhere.

Figure 5:
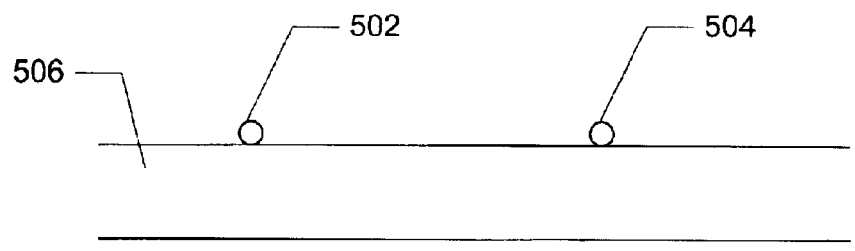
FIG. 5 illustrates the difficulty in seeing defects on a substrate.
Figure 6:
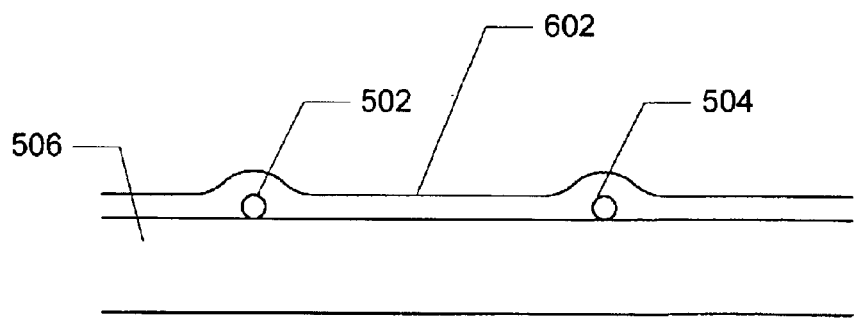
FIG. 6 illustrates the defects of FIG. 5 decorated with a film.

A problem with locating defects on a substrate also occurs when an optical defect inspection tool is used to find very small defects. FIG. 5 illustrates difficult to see defects on a substrate. Defects, such as particles 502 and 504, on the substrate 506 can be difficult to see under the optical defect inspection tool due to their very small size. To address this problem, the defects 502 and 504 are decorated with an opaque and conformal film, enhancing the appearance of the defects 502 and 504. FIG. 6 illustrates the defects of FIG. 5 decorated with a film. The film 602 can be a barrier metal deposition (BMD) layer or a polysilicon film or any other film which conforms and wraps around the defects 502 and 504 well. This film 602 enhances the defects 502 and 504, making them easier to see under the optical defect inspection tool.

Another problem with locating defects on a substrate when an optical defect inspection tool is used occurs when several layers of defects are viewed. As each layer is created on a substrate, it is examined with the optical defect inspection tool. However, with this tool, defects on layers underneath the examined layer are seen as well, making the defects on the current layer more difficult to see.

To address this problem, the optical defect inspection tool can be programmed to store the defect found in a layer once the layer has been examined. Then, when viewing subsequent layers, the tool can remove the stored defects, thus showing only the defects found in the currently examined layer. In this manner, the defects on the current layer are more easily seen.

A method for evaluating the effect of crystalline originated pits (COP's) in a silicon substrate on semiconductor devices has been disclosed. The method locates a first test structure created on a COP on the substrate and a second test structure created on the substrate but not on a COP. The electrical properties of the first and second test structure are then examined and compared. If there is a difference in their electrical properties, then the COP would affect a structure similar to the test structures of a semiconductor device. In this manner, the effects of COP's on the yield for the substrate can be understood.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for evaluating the effects of crystalline originated pits (COP's) in a silicon substrate on a semiconductor device, comprising the steps of:
   (a) locating a plurality of COP's on the substrate;
   (b) creating a first test structure on the substrate, wherein the first test structure is on a COP;
   (c) creating a second test structure on the substrate, wherein the second test structure is not on a COP;
   (d) examining electrical properties of the first and second test structures; and
   (e) determining if the electrical properties of the first test structure are different from the electrical properties of the second test structure.

2. The method of claim 1, wherein the first test structure comprises a first implant area, wherein the second test structure comprises a second implant area.

3. The method of claim 2, wherein the examining step (d) comprises:
   (d1) examining the first and second implant areas using a Scanning Electron Microscope (SEM) tool.

4. The method of claim 3, wherein the determining step (e) comprises:
   (e1) determining if the first implant area lights up differently than the second implant area under the SEM tool.

5. The method of claim 4, wherein if the first implant area lights up differently than the second implant area, then a COP would affect an implant in a semiconductor device.

6. The method of claim 1, wherein the first test structure comprises a first diode, wherein the second test structure comprises a second diode.

7. The method of claim 6, wherein the examining step (d) comprises:
   (d1) measuring junction breakdown voltages for the first and second diodes.

8. The method of claim 7, wherein the determining step (e) comprises:
   (e1) determining if there is a difference between the junction breakdown voltages of the first and second diodes.

9. The method of claim 8, wherein if there is difference between the junction breakdown voltages of the first and second diodes, then a COP would affect a junction breakdown voltage of a semiconductor device.

* * * * *

UNITED STATES PATENT AND TRADEMARK OFFICE
CERTIFICATE OF CORRECTION

PATENT NO. : 6,808,948 B1
DATED : October 26, 2004
INVENTOR(S) : Amy C. Tu et al.

It is certified that error appears in the above-identified patent and that said Letters Patent is hereby corrected as shown below:

Title page,
Item [75], Inventors, please replace "Eugene W. Hill" with -- W. Eugene Hill --.

Signed and Sealed this

Twenty-fourth Day of May, 2005

JON W. DUDAS
*Director of the United States Patent and Trademark Office*